(12) United States Patent
Yu et al.

(10) Patent No.: US 9,153,665 B2
(45) Date of Patent: *Oct. 6, 2015

(54) METHOD FOR FABRICATING SEMICONDUCTOR DEVICE

(71) Applicant: NANYA TECHNOLOGY CORPORATION, Taoyuan (TW)

(72) Inventors: Chien-An Yu, Taipei (TW); Yuan-Sung Chang, New Taipei (TW); Yi-Fong Lin, New Taipei (TW); Chin-Piao Chang, New Taipei (TW); Chih-Huang Wu, Taoyuan County (TW); Wen-Chieh Wang, Taoyuan County (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 123 days.

This patent is subject to a terminal disclaimer.

(21) Appl. No.: 13/792,228

(22) Filed: Mar. 11, 2013

(65) Prior Publication Data

US 2014/0252459 A1    Sep. 11, 2014

(51) Int. Cl.
*H01L 29/66* (2006.01)
*H01L 29/78* (2006.01)
*H01L 27/108* (2006.01)

(52) U.S. Cl.
CPC ...... *H01L 29/66666* (2013.01); *H01L 29/7827* (2013.01); *H01L 27/10814* (2013.01); *H01L 27/10873* (2013.01); *H01L 27/10891* (2013.01)

(58) Field of Classification Search
CPC .................... H01L 29/7827; H01L 29/66666
USPC .......................................... 257/330; 438/270
See application file for complete search history.

(56) References Cited

U.S. PATENT DOCUMENTS 6,211,039 B1 * 4/2001 Noble ............................ 438/412
8,237,220 B2 * 8/2012 Sung et al. .................... 257/328

FOREIGN PATENT DOCUMENTS

TW          575958          2/2004

OTHER PUBLICATIONS

"Office Action of Taiwan Counterpart Application," issued on Feb. 25, 2015, p1-p5, in which the listed reference was cited.

* cited by examiner

*Primary Examiner* — Matthew Reames
*Assistant Examiner* — Vincent Wall
(74) *Attorney, Agent, or Firm* — Jianq Chyun IP Office

(57) ABSTRACT

Provided is a method for fabricating a semiconductor device, which includes the following steps. A substrate having a plurality of pillars is provided, wherein a plurality of trenches are formed around each pillar, and a doped region is disposed at a bottom of each pillar. An insulation layer is formed below each doped region. In addition, a gate and a gate dielectric are formed on the sidewalls of each pillar.

11 Claims, 10 Drawing Sheets

METHOD FOR FABRICATING SEMICONDUCTOR DEVICE

BACKGROUND OF THE INVENTION

1. Field of Invention

The present invention relates to a method for fabricating an electronic device, more particularly, to a method for fabricating a semiconductor device.

2. Description of Related Art

In order to accelerate operating speed of integrated circuit and to meet customers' demands on miniaturizing electronic devices, physical dimensions of transistors in a semiconductor device are continuously shrunk. However, as the dimension of the transistor is reduced, its channel length will also decrease with ease leading to problems such as short channel effect and decrease in turn-on current. A conventional solution to said issue is to enhance the dopant concentration in the channel region. Nevertheless, this method causes an increase in a leakage current and therefore affects the reliability of devices.

To resolve said issue, the conventional horizontal transistor structure is recently replaced by a vertical transistor structure in the industry. For example, the vertical transistor structure is formed in a deep trench of the substrate. Alternatively, the vertical transistor structure may be formed on each pillar of a silicon pillar array. Hence, the operating speed and integration level of integrated circuits are enhanced and problems such as short channel effect are avoided. Currently, improvements in structural design and channel control of the existing vertical transistors are studied aggressively in this field.

SUMMARY OF THE INVENTION

The present invention is to provide a semiconductor device and a method for fabricating the same, which may improve the electrical isolation between the adjacent transistors in a vertical transistor array.

The present invention is to provide a semiconductor device and a method for fabricating the same, which may reduce the coupling effect between the adjacent transistors in a vertical transistor array.

The present invention provides a method for fabricating a semiconductor device including the following steps. First, a substrate having a plurality of pillars is provided, wherein a plurality of trenches are formed around each pillar. A doped region is disposed at the bottom of each pillar. An insulation layer is formed below each doped region.

According to an embodiment of the present invention, a portion of the substrate at the bottom of each trench is removed to form a plurality of openings before the formation of the insulation layer.

According to an embodiment of the present invention, the insulation layer is formed by performing an oxidation process to oxidize sidewalls of each opening so as to form an oxide layer.

According to an embodiment of the present invention, the oxidation process oxidizes sidewalls of adjacent openings such that the oxide layers formed below each doped region separate from each other, and the bottom of each doped region contacts with the substrate.

According to an embodiment of the present invention, the oxidation process oxidizes sidewalls of adjacent openings such that the oxide layers formed below each doped region merge with each other, and each doped region is isolated from the substrate by the oxide layers.

According to an embodiment of the present invention, a filling layer is formed in each opening before the formation the insulation layer.

According to an embodiment of the present invention, the filling layer is formed by chemical vapor deposition.

According to an embodiment of the present invention, before the formation of the insulation layer, a first protection liner and a second protection liner are formed in sequence on sidewalls of each trench, and then a portion of the first protection liner on the sidewall of the bottom of each pillar is removed.

According to an embodiment of the present invention, an undercut is formed at each doped region.

According to an embodiment of the present invention, a shielding layer is formed in each trench.

According to an embodiment of the present invention, a contact is formed on each shielding layer such that each shielding layer is connected to an external electrical source via the contact.

According to an embodiment of the present invention, the shielding layers are electrically connected to the substrate.

The present invention provides a method for fabricating a semiconductor device including the following steps. First, a substrate having a plurality of pillars is provided, wherein a plurality of trenches are formed around each pillar. A shielding layer is formed in the trenches.

According to an embodiment of the present invention, the shielding layer includes a conductive layer.

According to an embodiment of the present invention, the conductive layer includes doped polysilicon, doped epitaxial silicon, or metal.

According to an embodiment of the present invention, the trenches include a plurality of first trenches and a plurality of second trenches, the extending direction of the first trench being different from the extending direction of the second trench. A gate and a gate dielectric are disposed in each first trench and on the sidewall of each pillar.

According to an embodiment of the present invention, the shielding layer is disposed in each first trench and between adjacent gates.

According to an embodiment of the present invention, the shielding layer is disposed in each second trench.

According to an embodiment of the present invention, the shielding layer is disposed in each first trench and in each second trench.

According to an embodiment of the present invention, the formation of the shielding layer includes the following steps. An insulation liner is formed on the sidewall of each pillar. A shielding material layer is formed on the substrate to fill each trench, wherein the shielding material is located between the insulation liners.

According to an embodiment of the present invention, the shielding material layer is etched back to form the shielding layer, and a cap is formed on the shielding layer.

According to an embodiment of the present invention, a doped contact region is formed between the shielding layer and the substrate.

According to an embodiment of the present invention, a contact is formed on the shielding layer such that the shielding layer is connected to an external electrical source via the contact.

According to an embodiment of the present invention, the shielding layer is electrically connected to the substrate.

The present invention provides a method for fabricating a semiconductor device including the following steps. A substrate having a plurality of pillars is provided, wherein a plurality of trenches are formed around each pillar. A portion of each pillar is removed to form an undercut. A conductive layer is formed in each undercut.

According to an embodiment of the present invention, a doped region is disposed at the bottom of each pillar, and the undercut is formed above the doped region.

According to an embodiment of the present invention, a doped region is disposed at the bottom of each pillar, and the undercut is formed at the doped region.

According to an embodiment of the present invention, a shielding layer is formed between adjacent conductive layers.

According to an embodiment of the present invention, a shielding layer is formed in each trench.

According to an embodiment of the present invention, a contact is formed on the shielding layer such that the shielding layer is electrically connected to an external electrical source via the contact.

According to an embodiment of the present invention, the shielding layer is electrically connected to the substrate.

The present invention provides a semiconductor device including a plurality of pillars disposed on a substrate, wherein a plurality of trenches are formed around each pillar; a doped region disposed at the bottom of each pillar; and an insulation layer disposed below each doped region.

According to an embodiment of the present invention, an opening is formed in the substrate below each trench.

According to an embodiment of the present invention, the insulation layer includes an oxide layer disposed on a sidewall of each opening.

According to an embodiment of the present invention, the oxide layers below each doped region separate from each other such that the bottom of each doped region contacts with the substrate.

According to an embodiment of the present invention, the oxide layers below each doped region merge with each other such that each doped region is isolated from the substrate by the oxide layers.

According to an embodiment of the present invention, a filling layer is disposed in each opening.

According to an embodiment of the present invention, an undercut is disposed at the doped region.

According to an embodiment of the present invention, a shielding layer is disposed in the trenches.

According to an embodiment of the present invention, the shielding layer is disposed between the adjacent doped regions.

According to an embodiment of the present invention, the trenches include a plurality of first trenches and a plurality of second trenches, the extending direction of the first trenches being perpendicular to the extending direction of the second trenches, wherein a gate and a gate dielectric are disposed in each first trench and on the sidewall of each pillar.

According to an embodiment of the present invention, a contact is disposed on each shielding layer such that the shielding layer is electrically connected to an external electrical source by the contact.

According to an embodiment of the present invention, the shielding layer is electrically connected to the substrate.

According to an embodiment of the present invention, the shielding layer includes conductive material.

According to an embodiment of the present invention, the conductive material includes doped polysilicon, doped epitaxial silicon, or metal.

The present invention provides a semiconductor device, including a plurality of pillars disposed on a substrate, wherein a plurality of trenches are formed around each pillar, and an under cut is formed at each pillar; and a conductive layer disposed in each undercut.

According to an embodiment of the present invention, a doped region is disposed at the bottom of each pillar, and the undercut is formed above the doped region.

According to an embodiment of the present invention, a doped region is disposed at the bottom of each pillar, and the undercut is formed at the doped region.

According to an embodiment of the present invention, a shielding layer is disposed between the adjacent conductive layers.

According to an embodiment of the present invention, a shielding layer is disposed in each trench.

Accordingly, the present invention provides a semiconductor and a method for fabricating the same, which improves the electrical isolation for the adjacent transistors in a vertical transistor array. The present invention also provides a semiconductor and a method for fabricating the same, which reduces the coupling effect between the adjacent transistors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
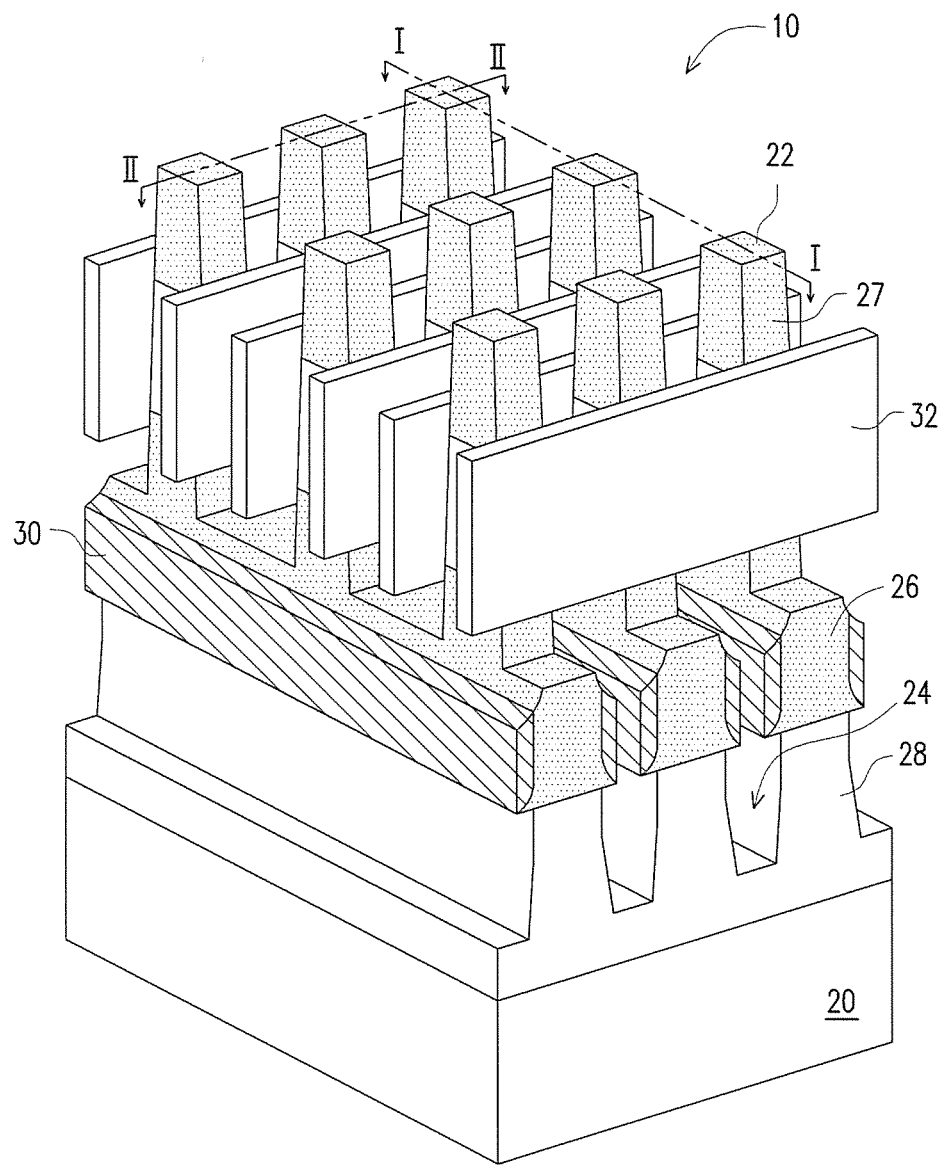
FIG. 1 is a schematic diagram of a semiconductor device according to the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a semiconductor device according to the present invention.

Referring to FIG. 1, a semiconductor device 10 according to the present invention includes a substrate 20 having a plurality of pillars 22. A plurality of trenches 24 are formed around each pillar 22. The trenches 24 include a plurality of first trenches and a plurality of the second trenches, wherein the extending direction of the first trenches may be parallel to that of line I-I, and the extending direction of the second trenches may be parallel to that of line II-II. A doped region 26 and a doped region 27 are disposed at the bottom and the top of each pillar 22, respectively. An insulation layer 28 is disposed below each doped region 26. In FIG. 1, the insulation layer 28 separates the doped region 26 and the substrate 20, but the present invention is not limited thereto. This will be described in detail in the following paragraphs. In addition, each pillar 22 may be fabricated into, for example, a vertical transistor, wherein the doped region 26 and the doped region 27 are respectively the source and the drain of the vertical transistor, or vice versa. Furthermore, the semiconductor device 10 may further include a plurality of bit lines 30 each connecting a plurality of doped regions 26, a plurality of word lines 32 (i.e. the gates of the vertical transistors), and a plurality of capacitors (not shown) each electrically connecting to each pillar 22 such that the semiconductor device 10 forms a dynamic random access memory (DRAM) array.

In the following paragraphs, the method for fabricating a semiconductor device of the present invention will be described by referring to the sectional views illustrating the fabricating process. Further, the present invention will be described by mainly referring to the sectional views taken along a certain direction, specifically, along the line II-II in FIG. 1.

FIGS. 2A to 2F are sectional views illustrating the fabrication process of a semiconductor device according to the first embodiment of the present invention, wherein the sectional views are taken along the line II-II in FIG. 1.

Figure 2A:
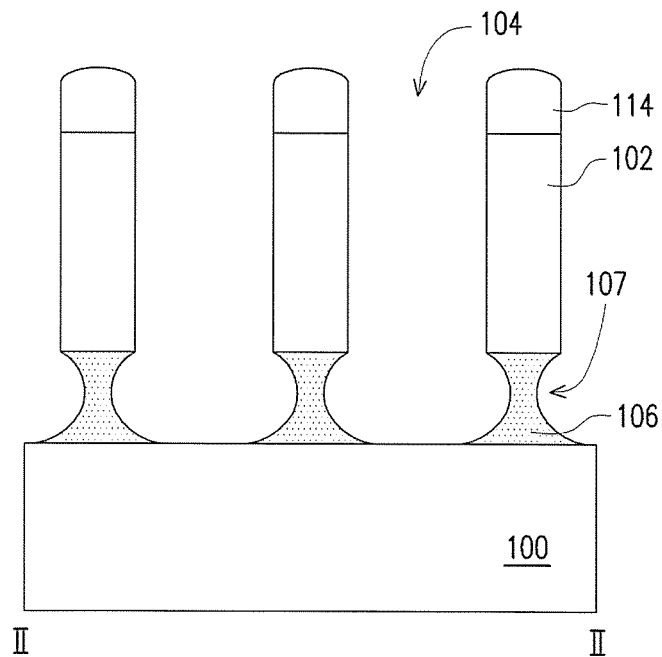
FIGS. 2A to 2F are sectional views of fabrication process of a semiconductor device according to the first embodiment of the present invention.

Referring to FIG. 2A, according to the first embodiment, the method for fabricating a semiconductor device includes the following steps. First, a substrate 100 such as a silicon substrate is provided. The substrate 100 has a plurality of pillars 102. The pillars 102 are formed by, for example, forming a plurality of first trenches (e.g. trenches 104 in FIG. 2A) and a plurality of second trenches in the substrate 100 by a dry etching process, wherein the extending direction of the first trenches is perpendicular to that of the second trenches. A doped region 106 is disposed at the bottom of each pillar 102. The doped region 106 is formed by, for example, ion implantation. The conductivity type of the doped region 106 may be opposite to that of the substrate 100. For example, if the substrate 100 is a p-type substrate, the doped region 106 may be formed by doping n-type dopants; if the substrate 100 is a n-type substrate, the doped region 106 may be formed by doping p-type dopants. Further, a cap 114 may be disposed at the top of each pillar 102. The material of cap 114 is different from that of pillar 102. The material of cap 114 is, for example, silicon oxide or silicon nitride. In addition, in one embodiment, an undercut 107 may be formed at the doped region 106, wherein the undercut 107 may be formed by an isotropic etching process, for example. The undercut 107 may increase the distance between the adjacent doped regions 106, and thus the parasitic capacitance may be reduced. However, the present invention is not limited thereto. In another embodiment, no undercut is formed at the doped region 106.

Figure 2B:
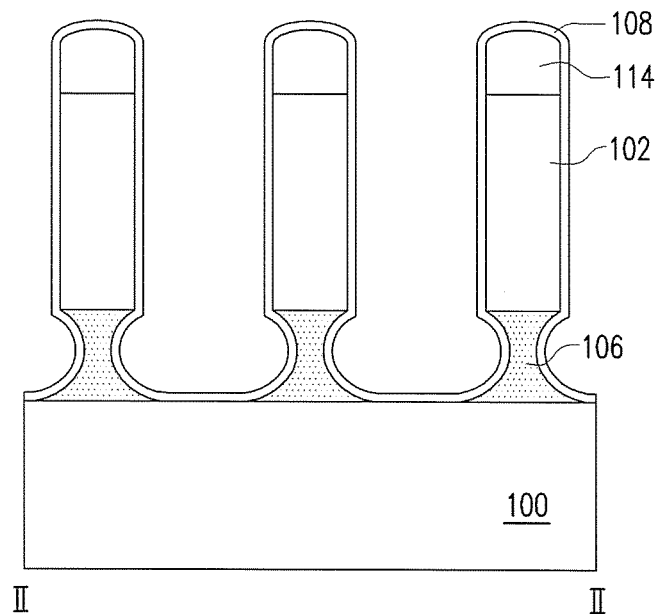

Referring to FIG. 2B, a protection liner 108 may be formed on the sidewall of pillars 102 and doped regions 106. The protection liner 108 may be composed of a single layer of material or stacked layers of different materials. The protection liner 108 includes, for example, silicon oxide, silicon nitride, or a combination thereof. The protection liner 108 may be formed by, for example, chemical vapor deposition (CVD).

Figure 2C:
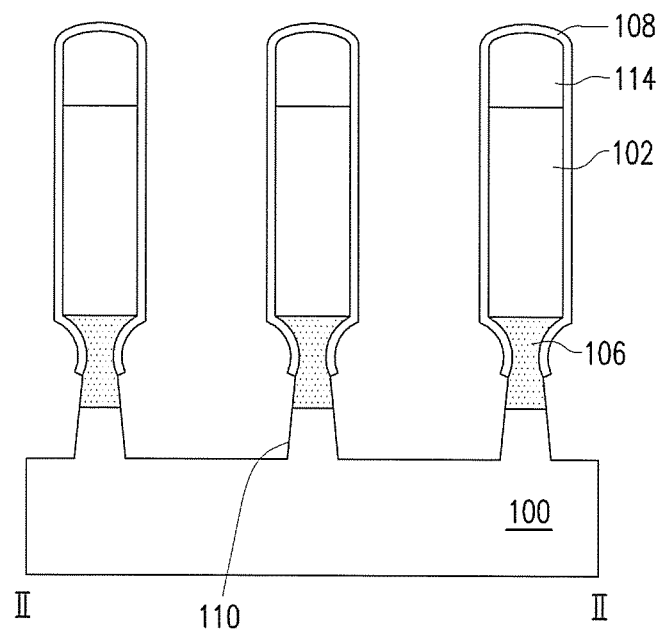

Referring to FIG. 2C, a portion of the protection liner 108 and a portion of the substrate 100 at the bottom of each trench 104 are removed to form a plurality of openings 110. The portion of the protection liner 108 and the portion of the substrate 100 may be removed by, for example, an anisotropic etching process such as a dry etching process.

Figure 2D:
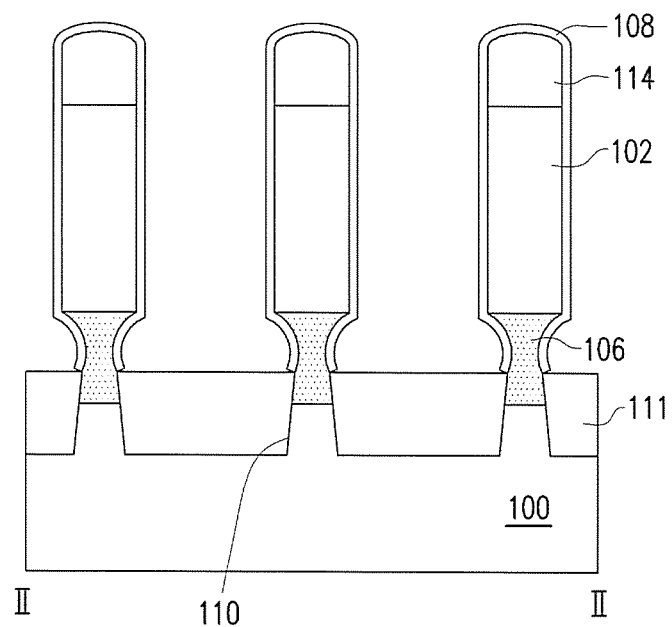

Referring to FIG. 2D, in the first embodiment, a filling layer 111 may be optionally formed in each opening 110 to provide better support for the pillars 22, i.e. to prevent the pillars 22 from collapse. The filling layer 111 may be formed by, for example, forming an oxide layer by sub-atmosphere chemical vapor deposition (SACVD), and etching back the oxide layer so that the remaining oxide layer is disposed in the openings 110.

Figure 2E:
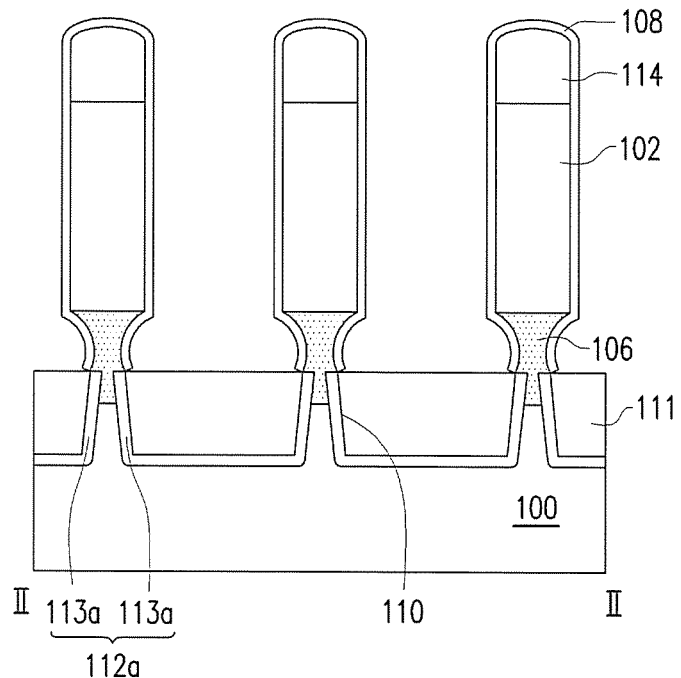
Figure 2F:
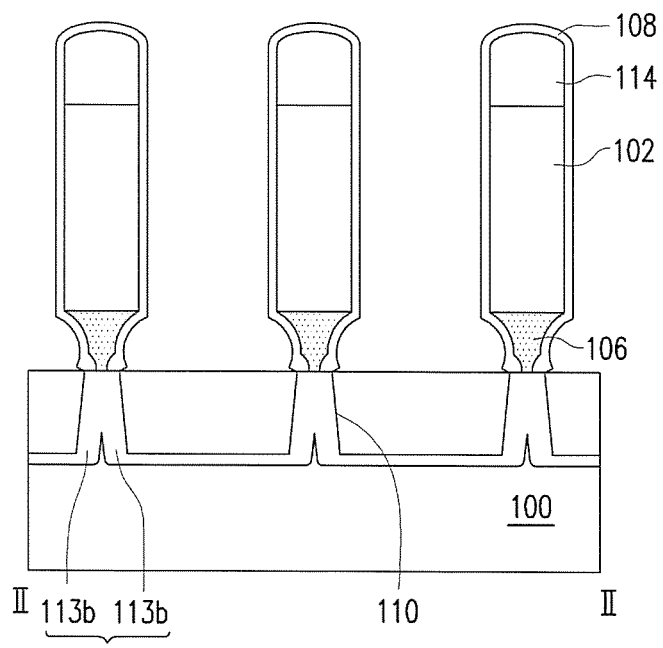

Referring to FIGS. 2E and 2F, an insulation layer 112a or an insulation layer 112b is formed below each doped region 106. The insulation layer 112a (or the insulation layer 112b) includes, for example, oxide. The insulation layer 112a (or the insulation layer 112b) is formed by, for example, performing an oxidation process to oxidize the sidewalls of each opening 110 to form an oxide layer 113a (or the oxide layer 113b). This oxidation process may also oxidize the bottom of each opening 110 (i.e. a portion of the substrate 110 below the filling layer 111). In FIG. 2E, the oxide layers 113a below each pillar 102 are separated from each other, and therefore the bottom of each doped region 106 contacts with the substrate 100. In FIG. 2F, the oxide layers 113b below each pillar 102 merge with each other, and therefore each doped region 106 is isolated from the substrate 100 by the insulation layer 112b.

Referring to FIGS. 2E and 2F, in the subsequent fabrication process for a semiconductor device, each pillar 102 may be fabricated into a vertical transistor. In the conventional fabrication process of a vertical transistor, dopants in the doped region at the bottom of each pillar may diffuse into the substrate, leading to a short circuit between adjacent transistors. According to the present invention, the insulation layer 112a or the insulation layer 112b disposed between the doped region 106 and the substrate 100 improves the electrical insulation for the adjacent transistors. Thus, the short circuit phenomenon may be reduced or prevented.

FIGS. 3A to 3D are sectional views illustrating the fabrication process of a semiconductor device according to the second embodiment of the present invention, wherein the sectional views are taken along the line II-II in FIG. 1.

Figure 3A:
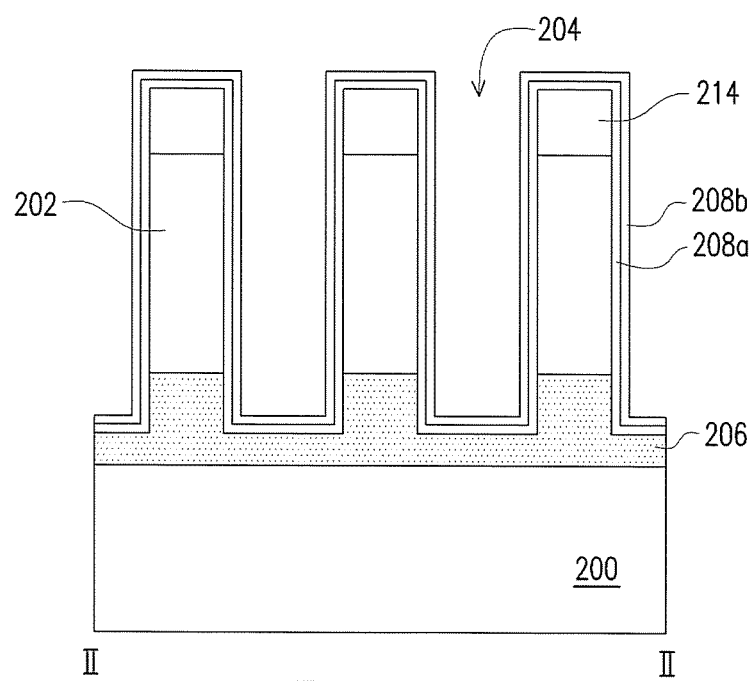
FIGS. 3A to 3D are sectional views of fabrication process of a semiconductor device according to the second embodiment of the present invention.

Referring to FIG. 3A, according to the second embodiment, the method for fabricating a semiconductor device includes the following steps. A substrate 200 having a plurality of pillars 202 is provided. A plurality of trenches 204 are formed around each pillar 202. A doped region 206 is disposed at the bottom of each pillar 202. A cap 214 is disposed at the top of each pillar 202. The material and forming method of the substrate 200, pillars 202, trenches 204, doped regions 206, and caps 214 may be identical to those of the substrate 100, pillars 102, trenches 104, doped regions 106, and caps 114 described in the first embodiment, and therefore the details are omitted here. Then, a first protection liner 208a is formed on the sidewalls of trenches 204, and a second protection liner 208b is formed on the first protection liner 208a. The forming method of the first protection liner 208a and the second protection liner 208b may be identical to that of the protection liner 108, but the material of the first protection liner 208a is different from that of the second protection liner 208b. For example, the first protection liner 208a may be composed of nitride and the second protection liner 208b may be composed of oxide.

Figure 3B:
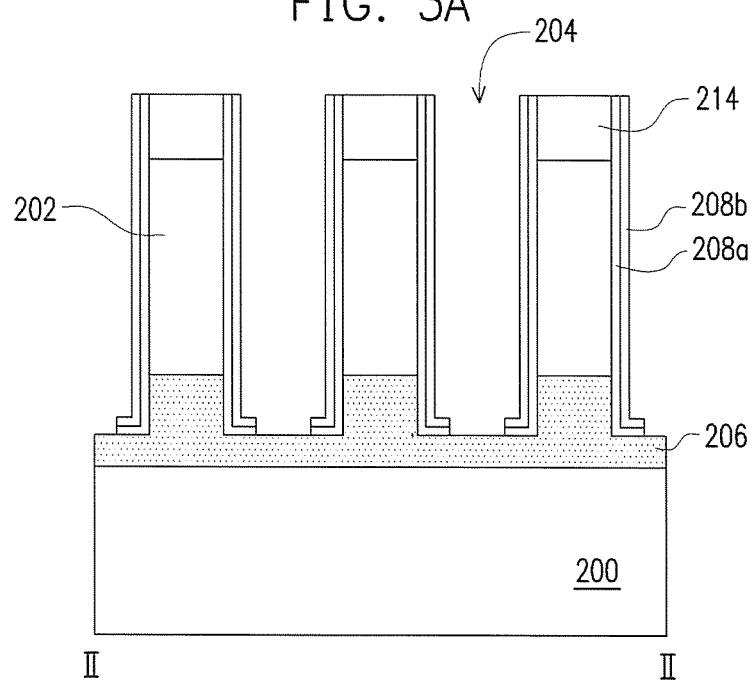

Referring to FIG. 3B, a dry etching process is performed to remove a portion of the first protection liner 208a and a portion of the second protection liner 208b at the bottom of each trench 204. The dry etching process may simultaneously remove a portion of the first protection liner 208a and a portion of the second protection liner 208b at the top of each pillar 202.

Figure 3C:
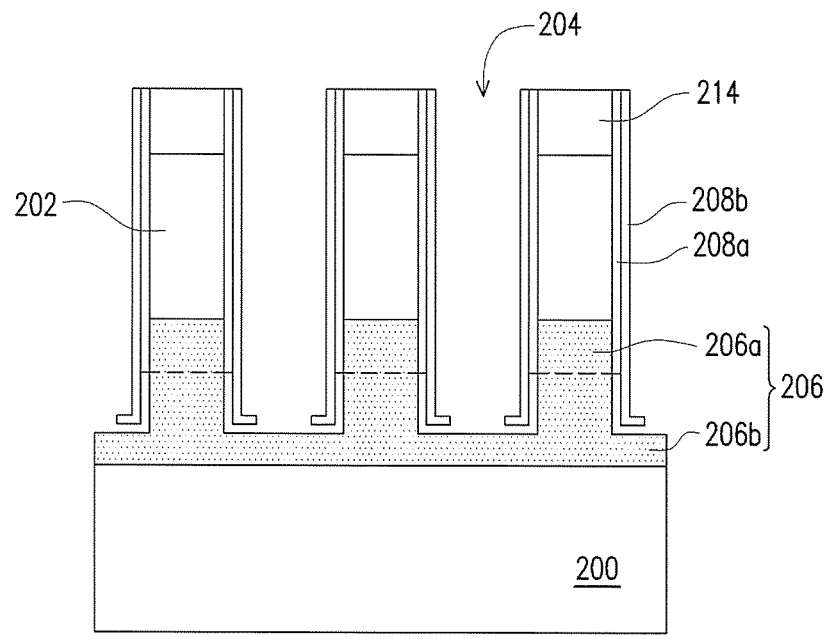

Referring to FIG. 3C, an etching process is performed to remove a portion of the first protection liner 208a on the side walls of each trench 204 such that gaps are formed between the second protection liner 208b and the substrate 200. The etching process may be, for example, a wet etching process having different etching rate on the first protection liner 208a and the second protection liner 208b.

Figure 3D:
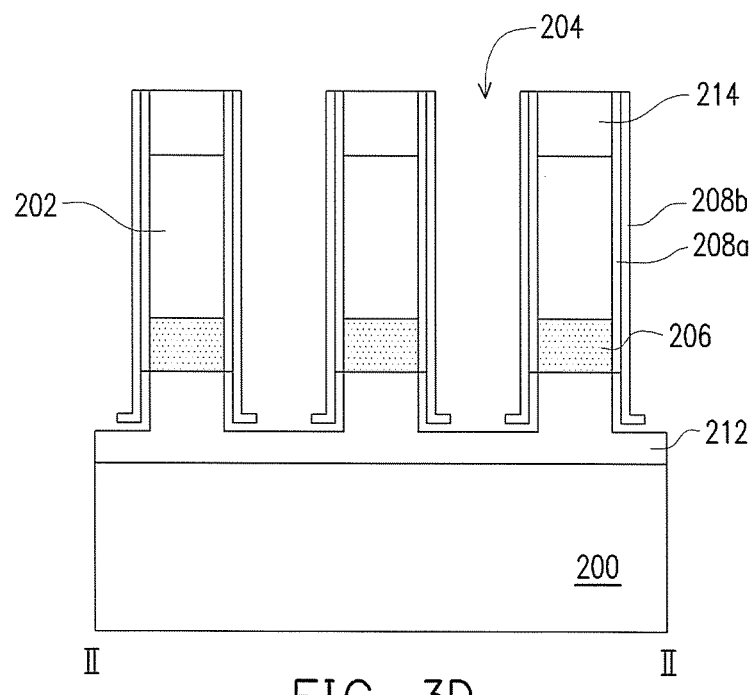

Referring to FIG. 3D, an oxidation process is performed to form an insulation layer 212 between the doped regions 206 and the substrate 200. The top region 206a of the doped region 206 (i.e. the part of doped region 206a above the dotted line in FIG. 3C) is protected from oxidation by the first protection liner 208a, while the remaining region 206b of the doped region 206 (i.e. the part of doped region 206a below the dotted line in FIG. 3C) is oxidized to form the insulation layer 212.

In fabrication process described above, the doped region 206 is protected by part of the first protection liner 208a. Thus, the doped region 206 may be prevented from complete oxidation during the formation of the insulation layer 212.

Figure 4A:
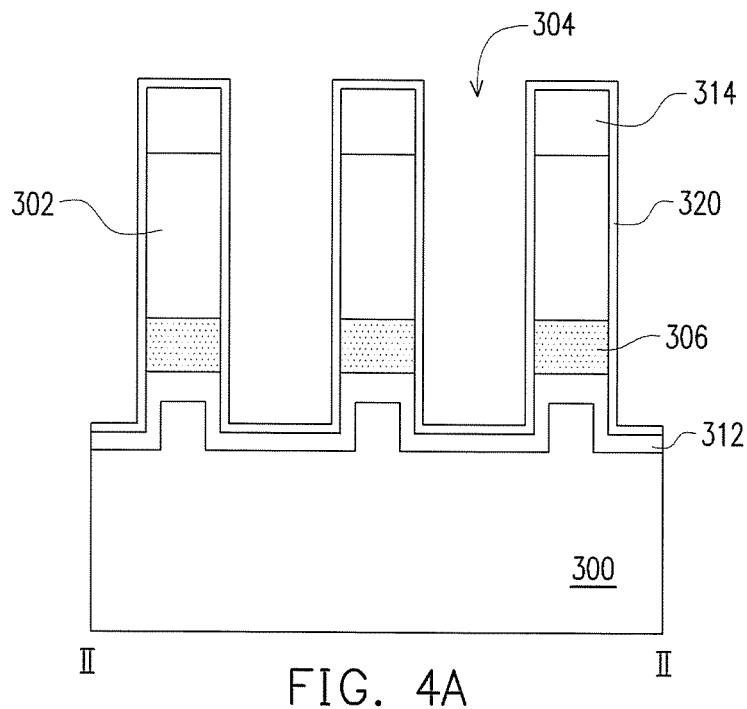
FIGS. 4A to 4D are sectional views of fabrication process of a semiconductor device according to the third embodiment of the present invention.
Figure 4B:
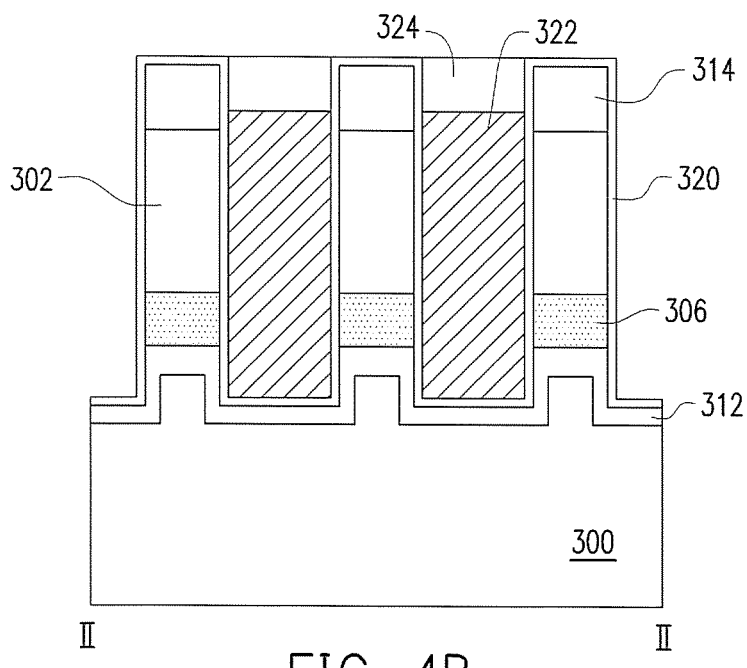
Figure 4C:
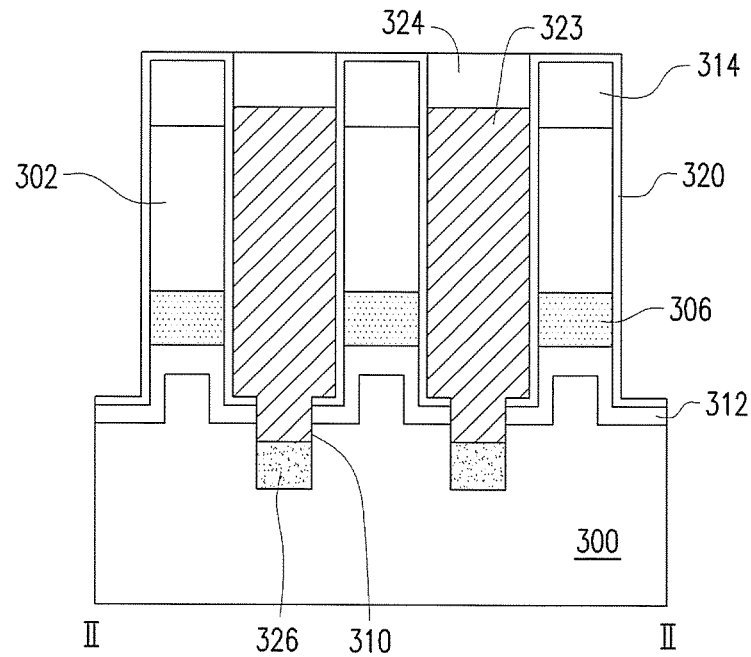
Figure 4D:
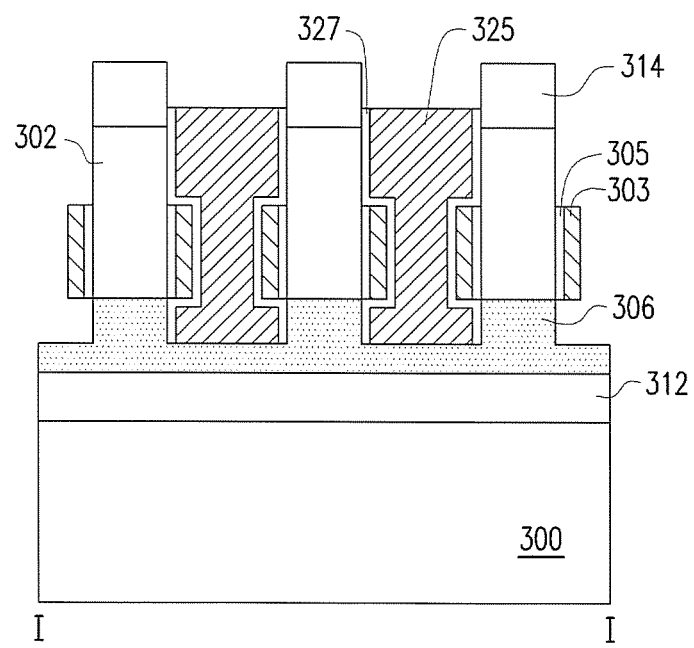

FIGS. 4A to 4D are sectional views illustrating the fabrication process of a semiconductor device according to the third embodiment of the present invention, wherein the sectional views of FIGS. 4A to 4C are taken along the line II-II in FIG. 1, and the sectional view of FIG. 4D is taken along the line I-I in FIG. 1.

Referring to FIG. 4A, according to the third embodiment, the method for fabricating a semiconductor device includes the following steps. A substrate 300 having a plurality of pillars 302 is provided, wherein a plurality of trenches 304 are formed around each pillar 302. Further, a doped region 306 may be disposed at the bottom of each pillar 302, and a cap 314 may be disposed at the top of each pillar 302. An insulation liner 320 may be disposed on the surface of each pillar 302. An insulation layer 312 may be disposed between each doped region 306 and the substrate 300. The material and forming method of the substrate 300, pillars 302, trenches 304, doped regions 306, insulation layers 312, and caps 314 may be similar to those of the substrate 100, pillars 102, trenches 104, doped regions 106, insulation layers 112a or 112b, and caps 114 shown in FIGS. 2A to 2F. The forming method of the insulation liner 320 may be identical to that of the protection liner 108 described in the first embodiment and shown in FIGS. 2B to 2F, and therefore the details are omitted here.

The present embodiment will be described on the basis of a structure in which the insulation layer 312 isolates the doped region 306 and the substrate 300, i.e. a structure similar to that shown in FIG. 2F but without the filling layer 111. The present invention, however, is not limited thereto.

Referring to FIG. 4B, a shielding layer 322 is formed between adjacent pillars 302. Specifically, referring to FIGS. 4A and 4B, the shielding layer 322 may be formed by, for example, filling a shielding material into the trench 304, and then etching back the shielding material. The shielding material may includes a conductive material such as doped polysilicon, doped epitaxial silicon, or metal (e.g. the conductive material may be Ti or TiN). The shielding material may be formed by CVD or epitaxy.

Next, a cap 324 is formed on each shielding layer 322. The cap 324 may be oxide, for example. The cap 324 may be formed by, for example, forming oxide by CVD, performing a chemical mechanical polishing (CMP) process to planarize the oxide, and performing an annealing process to the oxide.

Also, a contact (not shown) may be formed on each shielding layer 322. Thus the shielding layer 322 may be electrically connected to an external electrical source via the contact. The material and forming method of the contact may be any one of those known to the person skilled in the art, and therefore the detailed description is omitted here.

According to the third embodiment described above, the shielding layer 322 is isolated from the substrate 300 by the insulation layer 312, but the present invention is not limited thereto. Referring to FIGS. 4A and 4C, in another example of the third embodiment, an opening 310 may be formed at the bottom of each trench 304 by an etching process such as a dry etching process. Then, a shielding layer 323 is formed in each trench 304 and is electrically connected to the substrate 300. Further, before the formation of the shielding layer 323, a doped contact region 326 may be formed at the bottom of each opening 310. The doped contact region 326 may lower the contact resistance between the shielding layer 323 and the substrate 300. The doped contact region 326 may be formed by, for example, ion implantation. The conductivity type of the doped contact region 326, the conductivity type of the shielding layer 323, and the conductivity type of the substrate 300 may be identical to each other. The shielding layer 323 and the cap 324 may then be sequentially formed on the doped contact region 326.

Referring back to FIG. 1, the semiconductor device according to the present invention may have a plurality of first trenches and a plurality of the second trenches. The extending direction of the first trenches may be parallel to that of line I-I, and the extending direction of the second trenches may be parallel to that of line II-II. In the description based on FIGS. 4A to 4C, the semiconductor device is illustrated in sectional views taken along line II-II, wherein the trenches 304 are the first trenches. That is, the third embodiment discloses that a shielding layer may fill into each first trench of the semiconductor device. The present invention, however, is not limited thereto. A shielding layer may also fill into the second trench of the semiconductor device in another embodiment of the present invention, of which the sectional view is shown in FIG. 4D. In FIG. 4D, a gate 303 and a gate dielectric 305 are disposed on both of the opposing sidewalls of each pillar 302. A shielding layer 325 is disposed between the adjacent gates 303 and is electrically isolated from the gates 303 by dielectrics 327. The material and the forming method of the shielding layer 325 may be identical to those of the shielding layer 322 and the shielding layer 323. Further, a doped contact layer (not shown) may be disposed between the shielding layer 325 and the substrate 300, and a contact (not shown) or cap (not shown) may be disposed on the shielding layer 325. These structures are similar to those described above, and therefore the details are omitted here.

Referring to FIG. 4B, 4C, or 4D, in the subsequent fabrication process for a semiconductor device, each pillar 302 may be fabricated into a vertical transistor. As the size of the transistor gradually decreases, the coupling effect between the adjacent gates or adjacent source and drain becomes significant. According to present invention, a shielding layer is formed between adjacent gates or adjacent source and drain, and thus the coupling effect between adjacent transistors may be reduced. Further, if necessary, the shielding layer may be biased (e.g. via the contact electrically connected to an external electrical source or via the doped contact layer electrically connected to the base supply voltage $V_{BB}$) to prevent current leakage between the adjacent transistors.

Figure 5A:
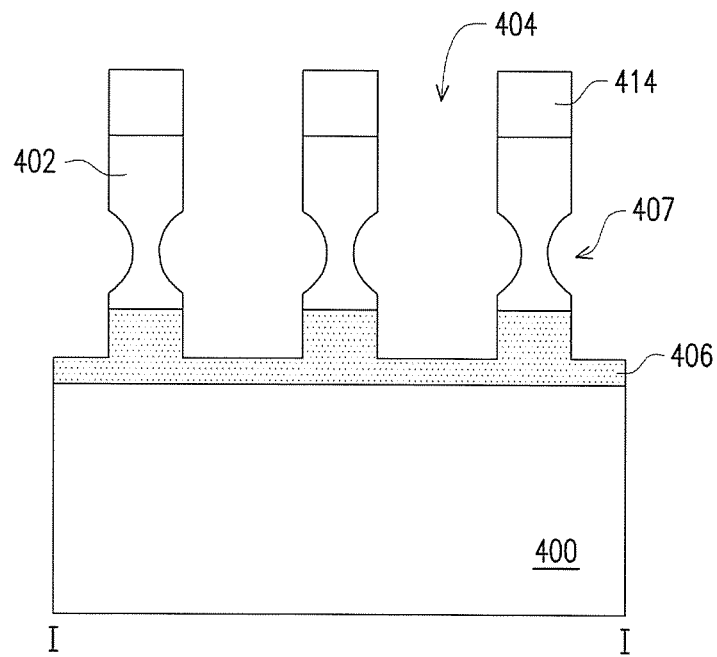
FIGS. 5A to 5D are sectional views of fabrication process of a semiconductor device according to the fourth embodiment of the present invention.
Figure 5B:
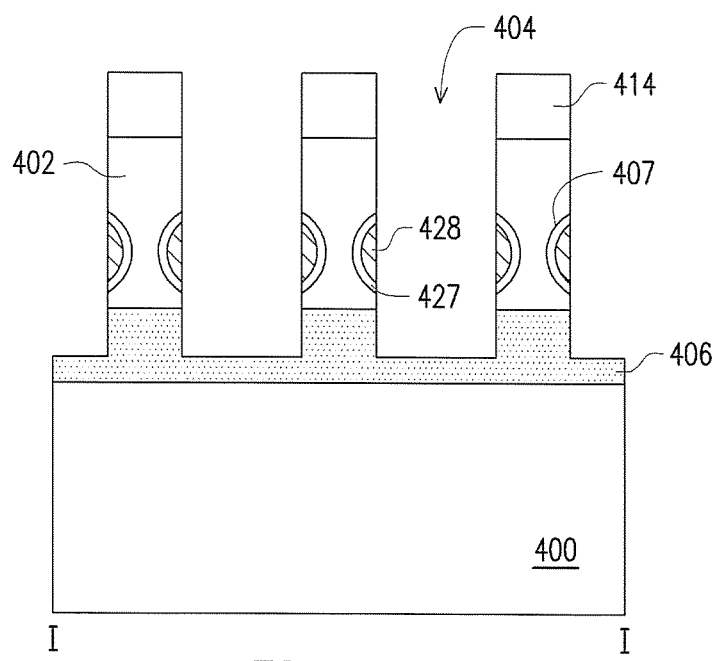

FIGS. 5A and 5B are sectional views illustrating the fabrication process of a semiconductor device according to the fourth embodiment of the present invention, wherein the sectional views are taken along line I-I in FIG. 1.

Referring to FIG. 5A, according to the fourth embodiment, the method for fabricating a semiconductor device includes the following steps. A substrate 400 having a plurality of trenches 404 is provided. A plurality of trenches 404 are formed around each pillar 402. A doped region 406 is disposed at the bottom of each pillar 402. A cap 414 is disposed at the top of each pillar 402. The material and forming method of the substrate 400, pillars 402, trenches 404, doped regions 406, and caps 414 may be identical to those of substrate 100, pillars 102, trenches 104, doped regions 106, and caps 114 in the first embodiment as shown in FIGS. 2A to 2F, and therefore the detailed description is omitted here.

Referring to FIG. 5A again, a portion of each pillar 402 is removed to form undercuts 407 on the doped region 406. Then, referring to FIG. 5B, a dielectric 427 and a conductive layer 428 are formed sequentially in each undercut 407 to completely or partially fill each undercut 407. In the subsequent process which fabricates each pillar 402 into a vertical transistor, the conductive layer 428 may be the gate of the transistor, and the dielectric 427 may be the gate dielectric. Further, the gates may be connected by a word line, as shown in FIG. 1.

Figure 5C:
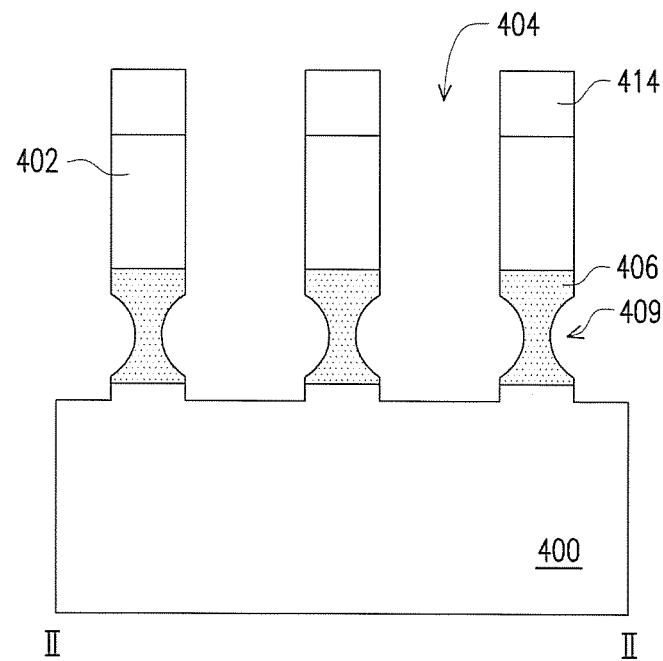
Figure 5D:
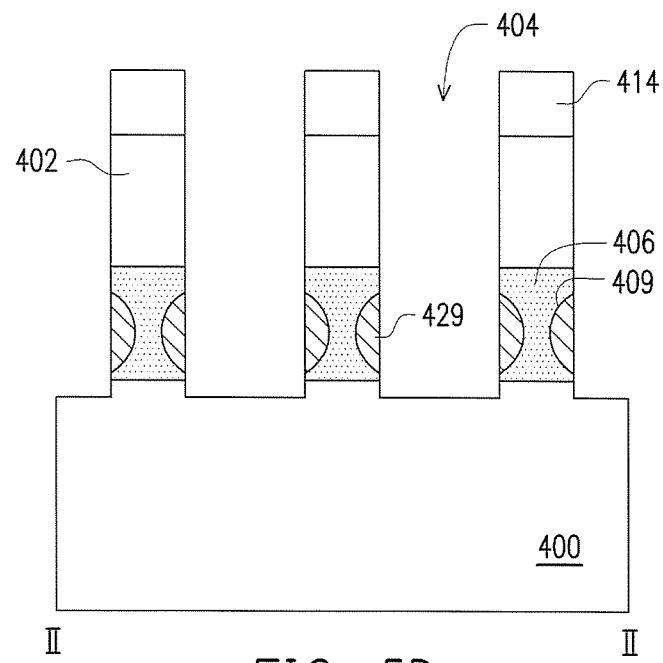

FIGS. 5C and 5D are sectional views illustrating the fabrication process of a semiconductor device according to another example of the fourth embodiment of the present invention, wherein the sectional views are taken along the line II-II in FIG. 1.

Referring to FIG. 5C, a substrate 400 having a plurality of pillars 402 is provided. A plurality of trenches 404 are formed around each pillars 402. A doped region 406 is disposed at the bottom of each pillar 402. A cap 414 is disposed at the top of each pillar 402. The material and forming method of the substrate 400, pillars 402, trenches 404, doped regions 406, and caps 414 may be identical to those of substrate 100, pillars 102, trenches 104, doped regions 106, and caps 114 in the first embodiment as shown in FIGS. 2A to 2F, and therefore the detailed description is omitted here.

Referring to FIG. 5D, a portion of each pillar 402 is removed to form undercuts 409 at the doped region 406. Then a conductive layer 429 is formed in each undercut 409. In the subsequent process which fabricates each pillar 402 into a vertical transistor, the conductive layer 429 may be the bit line connecting the source/drain (i.e. the doped regions 406) of each transistor, as shown in FIG. 1.

Further, a shielding layer may be formed between the adjacent conductive layers 428 or the conductive layers 429 by the process described in the third embodiment, of which the details are omitted here.

Referring to FIG. 5B or 5D, in the subsequent fabrication process for a semiconductor device, each pillar 402 may be fabricated into a vertical transistor. As the size of the transistor gradually decreases, the coupling effect between the adjacent gates or adjacent source and drain becomes significant. According to the present invention, a concave structure (the undercut 407 or the undercut 409) is formed on each pillar, and the distance between the adjacent gates or the adjacent source and drain thus increases. Therefore, the coupling effect between the adjacent transistors is reduced.

To sum up, according to the present invention, the electrical isolation between adjacent transistors in a vertical transistor array may be improved. Also, the coupling effect between adjacent transistors may be reduced by disposing a shielding layer or increasing the distance between the adjacent gates or the adjacent source and drain. Therefore, the performance of the vertical transistor array may be improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
a plurality of pillars disposed on a substrate, wherein a plurality of trenches are formed around each pillar;
a plurality of doped regions, wherein each doped region is disposed at a bottom of each pillar;
a plurality of insulation layers, wherein each insulation layer is disposed below each doped region; and
a shielding layer disposed in the trenches, wherein the shielding layer is electrically connected to the substrate.

2. The semiconductor device of claim 1, wherein a plurality of openings are formed in the substrate below the trenches.

3. The semiconductor device of claim 2, wherein the insulation layers comprise a plurality of oxide layers, wherein each oxide layer is disposed on a sidewall of each opening.

4. The semiconductor device of claim 3, wherein the oxide layers below each doped region are separated from each other such that a bottom of each doped region contacts with the substrate.

5. The semiconductor device of claim 3, wherein the oxide layers below each doped region merge with each other such that each doped region is isolated from the substrate by the oxide layers.

6. The semiconductor device of claim 2, further comprises a filling layer disposed in each opening.

7. The semiconductor device of claim 1, wherein an undercut is disposed at the doped region.

8. The semiconductor device of claim 1, wherein the shielding layer 1s disposed between the adjacent doped regions.

9. The semiconductor device of claim 1, wherein the trenches comprise a
plurality of first trenches and a plurality of second trenches, a extending direction of the first trenches being perpendicular to a extending direction of the second trenches, wherein a gate and a gate dielectlic are disposed in each first trench and on a sidewall of each pillar.

10. The semiconductor device of claim 1, wherein the shielding layer comprises conductive material.

11. The semiconductor device of claim 10, wherein the conductive material comprises doped polysilicon, doped epitaxial silicon, or metal.

* * * * *